United States Patent
Wittke et al.

(10) Patent No.: US 7,870,453 B2
(45) Date of Patent: Jan. 11, 2011

(54) CIRCUIT ARRANGEMENT AND METHOD OF TESTING AN APPLICATION CIRCUIT PROVIDED IN SAID CIRCUIT ARRANGEMENT

(75) Inventors: Michael Wittke, Pinneberg (DE); Friedrich Hapke, Winsen/Luhe (DE)

(73) Assignee: NXP B.V., Eindhoven (NL)

( * ) Notice: Subject to any disclaimer, the term of this patent is extended or adjusted under 35 U.S.C. 154(b) by 703 days.

(21) Appl. No.: 11/631,402

(22) PCT Filed: Jun. 27, 2005

(86) PCT No.: PCT/IB2005/052115

§ 371 (c)(1),
(2), (4) Date: Dec. 7, 2007

(87) PCT Pub. No.: WO2006/003596

PCT Pub. Date: Jan. 12, 2006

(65) Prior Publication Data

US 2008/0195907 A1    Aug. 14, 2008

(30) Foreign Application Priority Data

Jun. 30, 2004    (EP)    ................... 04103081

(51) Int. Cl.
*G01R 31/28*    (2006.01)
(52) U.S. Cl. .................. 714/732; 714/724; 714/733
(58) Field of Classification Search .................. 714/30, 714/724, 725, 726, 729, 732, 733, 734, 728, 714/738, 739; 716/4
See application file for complete search history.

(56) References Cited

U.S. PATENT DOCUMENTS

| | | | |
|---|---|---|---|
| 6,061,818 A | 5/2000 | Touba et al. | |
| 6,671,838 B1 | 12/2003 | Koprowski et al. | |
| 6,684,358 B1 | 1/2004 | Rajski et al. | |
| 7,039,844 B2 * | 5/2006 | Hapke | 714/733 |
| 7,055,077 B2 * | 5/2006 | Kiryu et al. | 714/726 |
| 7,296,249 B2 * | 11/2007 | Rinderknecht et al. | 716/4 |
| 7,299,394 B2 * | 11/2007 | Ichino et al. | 714/738 |
| 7,302,624 B2 * | 11/2007 | Rajski et al. | 714/732 |
| 7,437,640 B2 * | 10/2008 | Rajski et al. | 714/729 |
| 7,631,237 B2 * | 12/2009 | Kiryu | 714/736 |
| 2003/0140293 A1 | 7/2003 | Motika et al. | |

FOREIGN PATENT DOCUMENTS

| | | |
|---|---|---|
| DE | 100 38 327 | 2/2002 |
| DE | 101 10 777 | 9/2002 |

* cited by examiner

*Primary Examiner*—Phung M Chung

(57) ABSTRACT

According to an example embodiment, there is an integrated circuit arrangement with at least one application circuit to be tested, and with at least one self-test circuit for testing the application circuit and generating at least one pseudo-random test sample. wherein said The pseudo-random test sample is converted into at least one test vector that is programmable and/or deterministic and is supplied to the application circuit for testing purposes via at least one logic gate and at least one signal that is applied to said logic gate. The output signal arising in dependence on the deterministic test vector is evaluated by the application circuit by at least one signature register. Furthermore, there is a method of testing the application circuit such that Built In Self Test (BIST) hardware connected to the additional deterministic logic is reduced; it is suggested that the signal supplied to the logic gate is made available by a Bit Flipping Function (BFF) logic circuit based on at least one self-test circuit.

7 Claims, 3 Drawing Sheets

CIRCUIT ARRANGEMENT AND METHOD OF TESTING AN APPLICATION CIRCUIT PROVIDED IN SAID CIRCUIT ARRANGEMENT

FIELD OF THE INVENTION

The invention relates to an integrated circuit arrangement
with at least one application circuit to be tested, and
with at least one self-test circuit provided for testing the application circuit and
  generating at least one pseudo-random test sample,
  wherein said pseudo-random test sample can be converted into at least one test vector that is programmable and/or deterministic and that can be supplied to the application circuit for testing purposes
    via at least one logic gate and
  of with at least one signal that can be applied to said logic gate, and
With at least one signature register, the output signal arising in dependence on the deterministic test vector can be evaluated by the application circuit.
  (cf. prior-art publication DE 102 01 554 A1 which has a US-counterpart publication (application Ser. No. 10/501,796) now granted U.S. Pat. No. 7,039,844 B2 dated May 2, 2006).
With at least one self-test circuit, the invention further relates to a method of testing at least one application circuit provided in such an integrated circuit arrangement.

BACKGROUND OF THE INVENTION

It is a general wish in the manufacture of integrated circuits to test these integrated circuits as to their functionality. Such tests can be carried out by means of external testing arrangements. In an external test, however, many production-related problems and high expenses occur owing to
  the very high integration density of such integrated circuits,
  the very high clock frequencies at which these integrated circuits operate, and
  the very large number of test vectors required, which lead to complicated Very Large Scale Integration (VLSI) testing systems with large test vector memories.

The prior-art publication U.S. Pat. No. 6,061,818, U.S. Pat. No. 6,671,838, U.S. Pat. No. 6,684,358, and US 2003/0140293 A1 disclose possibilities for realizing such test arrangements; additionally, reference is made to the publications DE 100 38 327 A1 and DE 101 10 777 A1 from the prior art.

The test arrangements disclosed in these publications, however, are not suitable inter alia for solving test problems which are caused substantially by high Integrated Circuit (IC) internal clock frequencies and Input Output (I/O) bond pad stages that are very slow in comparison with the former. The high internal clock frequencies of the integrated circuits have indeed an unfavorable ratio to the comparatively very slow input/output bond pad stages that lead to the exterior.

It is desirable for this reason to have available a kind of self-test of the integrated circuit. A self-test circuit is provided in that case within the integrated circuit, serving to test the application circuit also provided in the integrated circuit. The application circuit is that circuit that is designed for the actual practical purpose of the integrated circuit.

A first step in solving the above problems is the use of the so-termed Build-In Self-Test (BIST) method. Conventionally, the circuit is made better capable of random testing, for example by the insertion of test points, or a so-termed Bit-Flipping Function (BFF) is used.

The conventional implementation based on logic gates of the additional deterministic logic BIST hardware (the so-termed DLBIST hardware) here leads to a too large additional DLBIST hardware in practice with real, large integrated circuit arrangements.

SHORT DESCRIPTION OF THE INVENTION

Object, Solution, Advantages

Given the disadvantages and imperfections described above, and taking into account the relevant prior art, the present invention has for its object to develop an integrated circuit arrangement of the kind mentioned in the opening paragraph and a method of the kind mentioned above further such that the additional BIST hardware can be reduced.

This object is achieved by means of an integrated circuit arrangement having the characterizing features of claim 1 and a method having the characterizing features of claim 6. Advantageous embodiments and useful further developments of the invention are characterized in the respective dependent claims.

The present invention is thus based on the principle of a Read Only Memory (ROM) implementation which is an alternative to the conventional gate-based implementation. The BFF used in this connection renders possible an error coverage of one hundred percent, which is not the case, for example, in a system based on waiting logic (for delimiting the present invention, for example, a so-termed waiting logic is used for improving the error coverage in the document U.S. Pat. No. 6,671,838 or the document US 2003/0140293 of the prior art).

According to the teachings of the present invention, it is achieved that the additional deterministic logic BIST hardware (so-termed DLBIST hardware) can be clearly reduced, i.e. the percentage of the DLBIST hardware has a more profitable ratio to the total surface area of the integrated circuit than is the case in the gate-based implementation (an additional DLBIST hardware surface area of 50% can definitely not be regarded as profitable, whereas a small DLBIST hardware surface area of a few percents can in this respect).

The essential advantage of the present invention is that a clear saving in surface area is made owing to the implementation of the DLBIST hardware based on a ROM compared with the conventional gate-based implementation, so that the additional DLBIST hardware is reduced to an acceptable surface area. The consequence of this area reduction is a clear cost reduction for the integrated circuit with the built-in logic self-test according to the present invention.

The invention finally relates to the use of at least one integrated circuit arrangement of the kind described above and/or a method of the kind described above for testing at least one application circuit.

The present invention accordingly relates to the technical field of integrated circuits (ICs), their design for testability (DfT), their computer-aided design (CAD), and their computer-aided testing (CAT); the present invention in particular relates to integrated circuit arrangements with very high integration densities and built-in self-test logic (so-termed BIST logic) for finding production defects in the logic part of the circuit.

SHORT DESCRIPTION OF THE DRAWINGS

As was noted above, there are various possibilities for implementing and further developing the teachings of the present invention in an advantageous manner. Reference is made in this respect to the claims dependent on claim 1 and those dependent on claim 6, while furthermore other embodiments, features, and advantages of the present invention are explained in more detail below, inter alia with reference to two embodiments shown in FIGS. 1 to 2B and given by way of example only.

In the drawing.

Identical or similar embodiments, elements, or features have been given the same reference numerals in FIGS. 1 to 2B.

DESCRIPTION OF PREFERRED EMBODIMENTS

Figure 1:
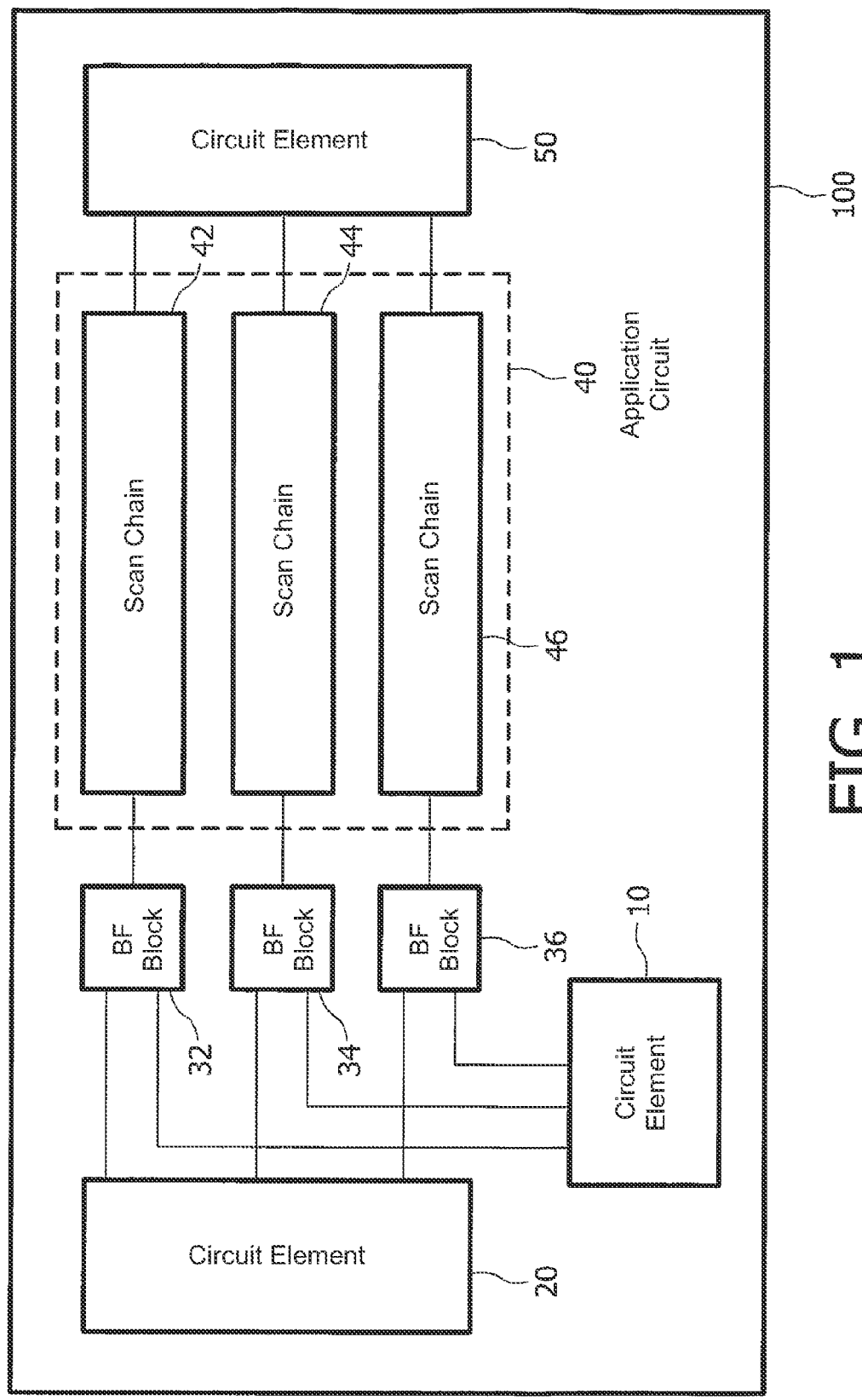
FIG. 1 is a block diagram of an embodiment of an integrated circuit arrangement according to the invention operating by the method according to the invention.

FIG. 1 is a block diagram of an integrated circuit arrangement (IC) 100 which comprises an application circuit 40. The application circuit 40 is that circuit that is designed for the practical use of the integrated circuit 100.

There is a desire to test the application circuit 40 for perfect operation after manufacture of the IC 100. For this purpose, a self-test circuit is provided on the integrated circuit 100, comprising the circuit elements 10, 20, 32, 34, 36, 50 as shown in FIG. 1.

In the integrated circuit 100 according to the invention, this self-test circuit is designed such that the associated circuit elements 10, 20, 32, 34, 36, 50 are arranged fully outside the application circuit 40, so that the behavior of the application circuit 40 during normal operation is not influenced by the self-test circuit.

It is assumed for the embodiment of FIG. 1 that the application circuit 40 comprises two circuit chains (so-termed scan chains with reference numerals 42, 44, 46), which chains are shift registers. Within the scope of the invention, however, it is alternatively possible that only one chain or only two chains, i.e. fewer shift registers, or more than three chains, i.e. further shift registers are provided. Furthermore, further circuit elements may be present.

The self-test circuit includes a linear feedback shift register (LFSR) 20 which supplies a pseudo-random sequence of test samples and that is usually fitted with an integrated or downstream-connected phase shifter. Since the shift register 20 is fed back and has only a finite length, this test sample sequence is not genuinely random, i.e. the test sample sequence exhibits a pattern that repeats itself at certain intervals.

Since this test sample sequence does not fully comprise all test samples that are optimally designed for testing the application circuit 40, first logic gates 32, 34, 36 are provided, which are each constructed as a bit flipper block, in particular each as a XOR logic link, which gates change the output signals of the linear fed-back shift register 20 such that test samples having a programmable and deterministic structure arise at the outputs of the first logic gates 32, 34, 36 and thus at the inputs of the application circuit 40 or its circuit chains 42, 44, 46.

This is achieved in that signals are supplied to the first logic gates 32, 34, 36 by a bit flipping function (BFF) logic 10 provided within the integrated circuit 100, by means of which signals the first logic gates 32, 34, 36 modify individual bits of the test sample supplied by the linear fed-back shift register 20 such that desired deterministic test samples are created.

The test vectors are supplied to the circuit chains 42, 44, 46 within the application circuit 40 in the embodiment of FIG. 1. Owing to these test samples, the circuit chains 42, 44, 46 supply output signals within the application circuit 40 which reach a signature register 50 (a so-called multiple input signature register or MISR).

The signature register 50 is constructed such that it forms a combination of the test results over a plurality of test cycles, each comprising one test sample, and supplies a so-termed signature after the test procedure, which signature has to exhibit a certain, predetermined value in the case of a zero-defect performance of the application circuit 40.

It is ensured in this manner that those bits that reach the signature register 50 during testing can definitely be evaluated. This in its turn means that the signature result present in the signature register 50 after the performance of several test cycles can be fully evaluated and supplies a reliable test result.

An essential advantage of the integrated circuit 100 according to the invention with the self-test circuit 10, 20, 32, 34, 36, 50 is that the application circuit 40 need not be modified for the test processes; this means that the application circuit 40 can be constructed in a manner which is an optimum for the use of the application circuit 40. The self-test circuit 10, 20, 32, 34, 36, 50 does not influence the normal operation of the application circuit 40 in its practical use in any way whatsoever.

Furthermore, the self-test circuit 10, 20, 32, 34, 36, 50 according to the invention renders it possible to carry out a test of the application circuit 40 on the chip, so that comparatively slow bond pad connections do not interfere with the testing, and the operation of the application circuit 40 can take place at maximum clock speeds.

The object being to achieve a significant surface area reduction of the modified hardware, and accordingly a clear cost reduction of the integrated circuit 100 with the built-in logic self-test according to the present invention, the essential feature of the circuit 100 shown in FIG. 1 lies in the fact that the BFF logic 10 is realized by means of a ROM-based process control.

The various combinations 104o2 (cf. FIGS. 2A and 2B) for the bit flipper (BF) blocks 32, 34, 36 and the information as to when these combinations 104o2 are to be created (so-called wait signals 104o1) are laid down in a special micro read-only memory (ROM) unit 102.

A counter 122 constructed as a downcounter is loaded with the number of waiting cycles 104o1 from the micro ROM 102. As long as the value of this counter is not equal to zero, the bit flip (BF) blocks 32, 34, 36 should be inactive. The counter 122 accordingly generates a signal 122o2 (for example flip="1") which is combined with the bits of the combination 104o2 via a second logic gate 132 AND, thus preventing a flipping of the bit flip (BF) blocks 32, 34, 36.

The counter 122 counts backwards. If the counter position of this downcounter 122 is equal to zero, a "1" state is generated, and the combination 104o2 in the micro ROM 102 activates the bit flip (BF) blocks 32, 34, 36. At the same time, an address counter 112 increments the counter unit 122 by means of the first output signal (=increment or "inc" signal referenced 122o1), thus pointing to the next value of the micro ROM 102 (<--> output signal 112o of the address counter unit 112); the waiting cycles 104o1 of the micro ROM 102 are then loaded into the counter 122 again.

Figure 2A:
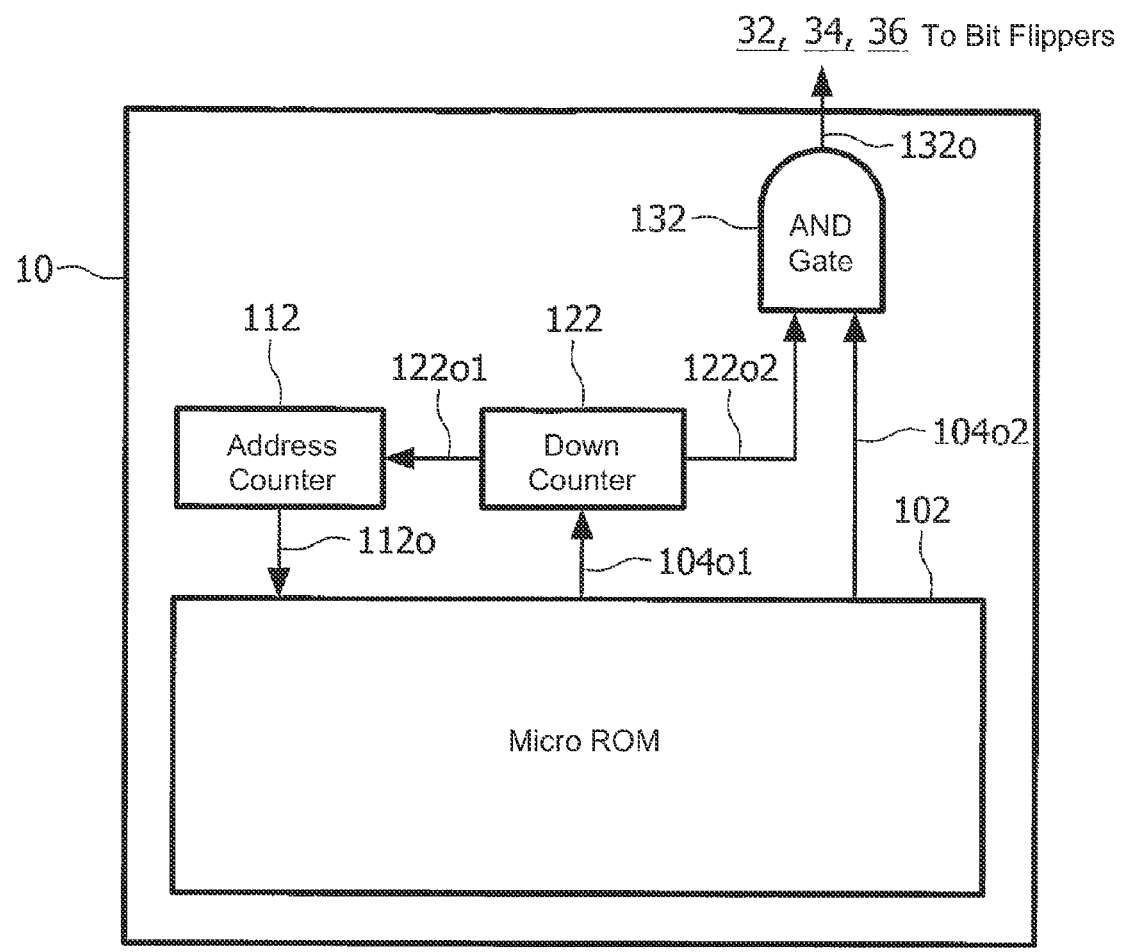
FIG. 2A is a block diagram of a first embodiment for a ROM-based BFF logic circuit in the circuit arrangement of FIG. 1.
Figure 2B:
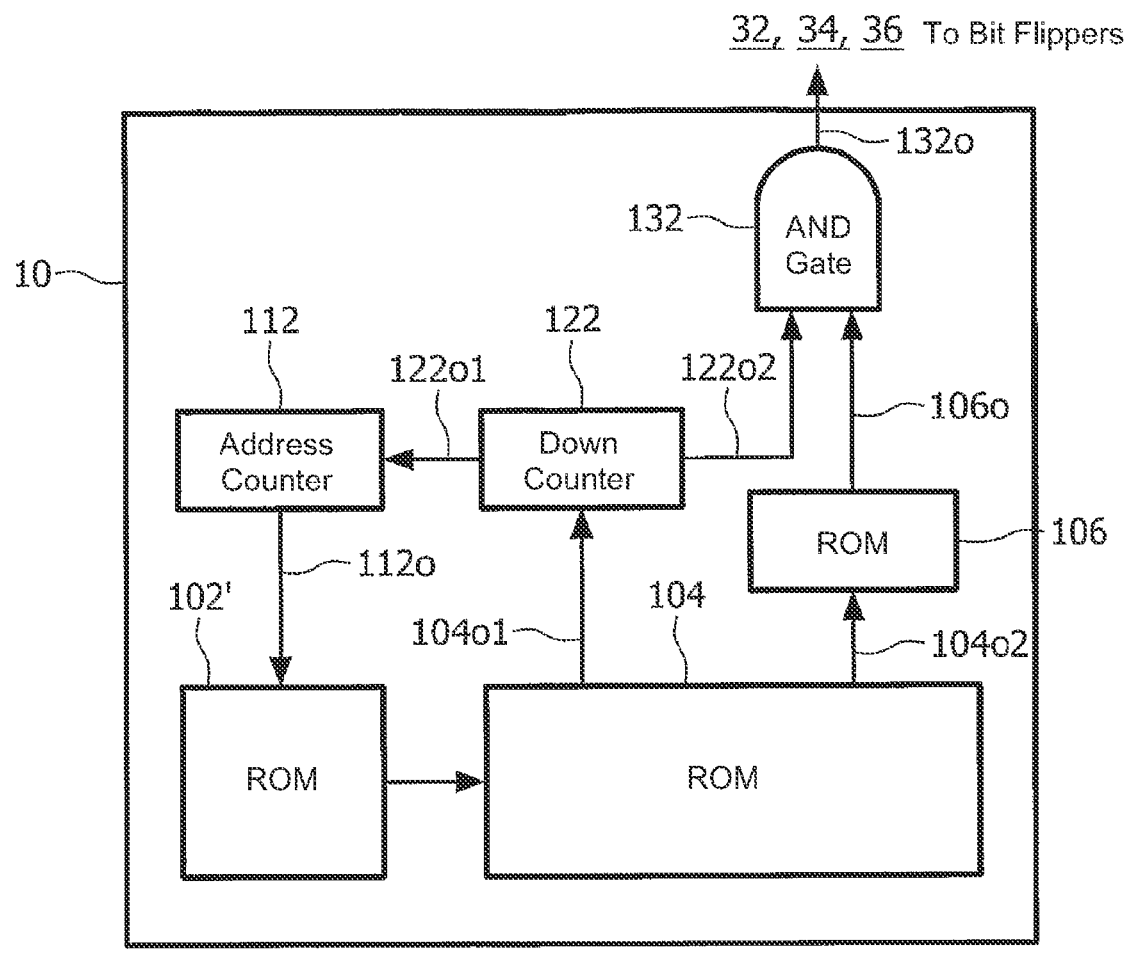
FIG. 2B is a block diagram of a second embodiment for a ROM-based BFF logic circuit in the circuit arrangement of FIG. 1.

FIG. 2B shows how the micro ROM can be subdivided into three smaller ROMs 102', 104, 106 in a second embodiment of the ROM-based BFF logic circuit 10 in the circuit arrangement 100 of FIG. 1 that is further optimized as regards chip surface area compared with the first embodiment of FIG. 2A. The redundant information present in the micro ROM is reduced thereby for the purpose of further minimizing the chip surface area for the bit flipping logic 10.

This embodiment utilizes the circumstance that only few different combinations 104o2 occur as a rule, i.e. many combinations occur often in the micro ROM. Fifty percent or more of the total ROM surface area can be saved in practical circuits in that these few different combinations 104o2 are encoded and the actual combination that are many bits wide are stored in a separate ROM.

The various addresses of the combinations 104o2 for the bit flipper (BF) blocks 32, 34, 36 are stored in an individual ROM, the so-termed "Comb-ROM" or combination ROM 106, whose output signal 106o is fed to the second AND logic gate 132.

The interface ROM 104 comprises the addresses of the combinations 104o2 and the number of waiting cycles 104o1 until the next combination 104o2 is applied to the bit flipper 32, 34, 36.

The word width of the micro ROM 102' is given by the number of different wait combinations 104o1, 104o2.

The wait signals 104o1 in the interface ROM 104 activate the downcounter 122, which counts down to zero from the wait value. As long as the value of this downcounter 122 is not equal to zero, the bit flippers 32, 34, 36 should not be active; the downcounter 122 delivers the value "1" during this time to the AND gate 132 in front of the bit flippers 32, 34, 36, thus preventing the bit flipping.

When the downcounter 122 has reached the zero value, the value "1" is supplied to the AND gate 132 in front of the bit flippers 32, 34, 36; the individual bit flippers 32, 34, 36 can then flip in accordance with the value of the Comb-ROM via the output signal 132o of the second logic gate 132.

When the downcounter 122 has reached the zero value, the address counter 112 is incremented, and the next address of the micro ROM 102' is thus selected via the address output signal 112o of the address counter unit 112.

The present invention clearly distinguishes itself from the embodiment from the publication U.S. Pat. No. 6,061,818 of the prior art, because in the embodiment of the publication U.S. Pat. No. 6,061,818 a bit-fixing sequence generator generates a fix signal for the state "0" on an OR linking logic, or a fix signal for the state "1" on an AND linking logic.

In the present invention, by contrast, there is always only one control signal which arises from the ROM-based BFF logic 10 and to which a XOR linking logic 32, 34, 36 is applied in each case.

Furthermore, the present invention also clearly distinguishes itself from the embodiment of the publication U.S. Pat. No. 6,684,358 of the prior art in that no full self-test takes place in the embodiment of U.S. Pat. No. 6,684,358, because a test system is still always required for making available the test stimuli: furthermore, the linear feedback shift register (LFSR) constructed as a decompressor in the embodiment of U.S. Pat. No. 6,684,358 has a connection to chip inputs, in contrast to the present invention.

Overall, the self-test circuit 10, 20, 32, 34, 36, 50 according to the invention, and in particular the ROM-based BFF logic 10 according to the invention, enable a testing of the application circuit 40 on the chip without being subject to any restrictions. No modification of the application circuit 40 is required, so that this application circuit 40 can be optimally designed for its practical function.

According to the invention, a testing at full clock speeds is also possible, because the slow, external bond pad connections need not be used for testing.

All test processes are also possible without restrictions for those application circuits that comprise components with a storage or analog behavior.

It is furthermore safeguarded that only those test samples reach the circuit 40 under test for which it is true that they are actually the desired deterministic or random test samples. Nevertheless, the constructional expenditure of the ROM-based BFF logic 10, and thus also the space requirement on the integrated circuit, can be kept small.

LIST OF REFERENCE NUMERALS

100 integrated circuit arrangement, in particular integrated circuit chip

10 bit flipping function (BFF) logic circuit

20 shift register, for example linear backfed shift register, in particular with integrated and/or downstream phase shifter

32 logic gate associated with the first circuit chain 42, in particular bit flipper (BF) block, in particular XOR logic link

34 logic gate associated with the second circuit chain 44, in particular bit flipper (BF) block, in particular XOR logic link

36 logic gate associated with the third circuit chain 46, in particular bit flipper (BF) block, in particular XOR logic link

40 application circuit

42 first circuit chain

44 second circuit chain

46 third circuit chain

50 signature register, in particular multiple input signature register

102 read-only memory (ROM) unit, in particular micro ROM unit (first embodiment, cf. FIG. 2A)

102' read-only memory (ROM) unit, in particular micro ROM unit (second embodiment, cf. FIG. 2B)

104 interface ROM unit (second embodiment, cf. FIG. 2B)

104o1 first output signal, in particular wait cycle or wait signal, of the ROM unit 102 or interface ROM unit 104

104o2 second output signal, in particular combination signal of the ROM unit 102 or interface ROM unit 104

106 combination ROM unit (second embodiment, cf. FIG. 2B)

106o output signal of the combination ROM unit 106 (second embodiment, cf. FIG. 2B)

112 address counter unit

112o output signal, in particular address or address signal, of the address counter unit 112

122 counter unit, in particular downcounter

122o1 first output signal, in particular increment or "inc" signal, of the counter unit 122

122o2 second output signal of the counter unit 122

132 second logic gate, in particular AND gate

132o output signal of the second logic gate 132

The invention claimed is:

1. An integrated circuit comprising:
   at least one application circuit to be tested; and
   at least one self-test circuit provided for testing the application circuit and generating at least one pseudo-random test sample,
   wherein the at least one pseudo-random test sample is converted into at least one test vector that is programmable and/or deterministic and is supplied to the at least one application circuit for testing purposes via at least one logic gate and through at least one signal that is applied to the at least one logic gate, and
   wherein an output signal arising in dependence on the at least one test vector is evaluated by the at least one application circuit using at least one signature register,
   wherein the at least one signal to be supplied to the at least one logic gate is made available by at least one bit flipping function (BFF) logic circuit, wherein the at least one BFF logic circuit comprises:
   at least one read-only memory (ROM) unit;
   at least one address counter unit whose output signal is applied to the at least one ROM unit;
   at least one counter unit, to which at least a first ROM output signal of the at least one ROM unit is applied, and which activates the at least one address counter unit with at least a first counter output signal; and
   at least a second logic gate, to which at least a second counter output signal of the at least one counter unit and at least a second ROM output signal of the at least one ROM unit is applied.

2. The integrated circuit of claim 1, wherein the at least one self-test circuit comprises at least one linear feedback shift register for the purpose of generating the at least one pseudo-random test sample.

3. The integrated circuit of claim 1, wherein the at least one logic gate is constructed as at least on bit-flipper (BF) block.

4. The integrated circuit of claim 1, wherein the at least one ROM unit comprises:
   at least one micro ROM unit to which the output signal of the at least one address counter unit is applied;
   at least one interface ROM unit which supplies the first ROM output signal to the at least one counter unit; and
   at least one combination ROM unit to which the second ROM output signal is applied.

5. A method of testing at least one application circuit using at least one self-test circuit, comprising the following steps:
   generating at least one pseudo-random test sample by the at least one self-test circuit;
   modifying the at least one pseudo-random test sample into at least one programmable and/or deterministic test vector that is supplied to the application circuit for testing purposes by at least one logic gate and through at least one signal that is applied to the at least one logic gate and that is made available by a bit-flipping function (BFF) logic circuit based on at least one read-only memory (ROM) unit;
   applying at least one output signal of at least one address counter unit of the BFF logic circuit to the at least one ROM unit of the BFF logic circuit; and
   evaluating an output signal obtained from the at least one application circuit in dependence on the at least one programmable and/or deterministic test vector by at least one signature register.

6. The method of claim 5, wherein the method further comprises:
   applying at least a first ROM output signal of the ROM unit to at least one counter unit of the BFF logic circuit; and
   applying at least a first counter output signal from the at least one counter unit to the address counter unit.

7. The method of claim 6, wherein the method further comprises applying at least a second counter output signal of the counter unit as well as at least a second ROM output signal of the ROM unit to at least a second logic gate of the BFF logic circuit.

* * * * *